US006300038B1

(12) United States Patent
Shimazu et al.

(10) Patent No.: US 6,300,038 B1
(45) Date of Patent: Oct. 9, 2001

(54) ARTICLES HAVING IMAGABLE COATINGS

(75) Inventors: Ken Shimazu, Briarcliff Manor, NY (US); Gareth Rhodri Parsons; John David Riches, both of West Yorkshire (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/444,125

(22) Filed: Nov. 19, 1999

(51) Int. Cl.[7] ....................................................... G03C 1/76
(52) U.S. Cl. ........................... 430/270.1; 430/5; 430/302; 430/311; 430/320
(58) Field of Search .............................. 430/270.1, 272.1, 430/273.1, 302, 5, 311, 320; 101/453, 463.1, 465, 467

(56) References Cited

U.S. PATENT DOCUMENTS

| | | | |
|---|---|---|---|
| 5,266,453 | * 11/1993 | Matushita et al. | 430/517 |
| 5,816,162 | * 10/1998 | Vermeersch | 101/467 |
| 5,948,591 | * 9/1999 | Vermeersch et al. | 430/270.1 |
| 5,981,144 | * 11/1999 | Damme et al. | 430/271.1 |
| 6,001,536 | * 12/1999 | Vermeersch et al. | 430/302 |
| 6,004,727 | * 12/1999 | Verlinden et al. | 430/302 |
| 6,022,667 | * 2/2000 | Vermeersch et al. | 430/271.1 |
| 6,030,750 | * 2/2000 | Vermeersch et al. | 430/302 |
| 6,060,218 | * 5/2000 | Van Damme et al. | 430/302 |
| 6,080,523 | * 6/2000 | Vermeersch et al. | 430/270.1 |
| 6,152,036 | * 11/2000 | Verschueren et al. | 101/457 |
| 6,153,353 | * 11/2000 | Van Damme et al. | 430/270.1 |
| 6,245,477 | * 6/2001 | Ray et al. | 430/138 |

FOREIGN PATENT DOCUMENTS

| | | |
|---|---|---|
| 0689096 | 12/1995 | (EP) . |
| 0832739 | 4/1998 | (EP) . |
| WO 9739894 | 10/1997 | (WO) . |
| WO 9901795 | 1/1999 | (WO) . |
| WO 9901796 | 1/1999 | (WO) . |
| WO 9908879 | 2/1999 | (WO) . |
| WO 9911458 | 3/1999 | (WO) . |
| WO 9921715 | 5/1999 | (WO) . |
| WO 9921725 | 5/1999 | (WO) . |

OTHER PUBLICATIONS

Rodriguez, Ferdinand, "Principles of Polymer Science," 3rd Ed., pp. 367–370.
An excerpt from *Surface and Collid Science*: "Wettability and Contact Angles", vol. 2, p. 131–137, Wiley–Interscience a division of John Wiley & Sons, Inc., 1969.

* cited by examiner

Primary Examiner—Janet Baxter
Assistant Examiner—Barbara Gilmore
(74) Attorney, Agent, or Firm—Baker Botts L.L.P.

(57) ABSTRACT

A heat imagable article has, in a single layer polymeric coating or in an inner layer of a multi-layer polymeric coating on a substrate, a polymeric matrix material, for example a phenolic resin, and, dispersed therein, polymeric particles, for example of polyethylene or polytetrafluoroethylene. The coating may contain a radiation absorbing compound so that suitable electromagnetic radiation, preferably infra-red radiation, may be used to heat the coating imagewise. The presence of the particles increases the physical robustness of the layer.

31 Claims, 8 Drawing Sheets

ARTICLES HAVING IMAGABLE COATINGS

FIELD OF THE INVENTION

The present specification relates to articles having positive working heat imagable coatings, for example precursors which are imaged and developed in the production of lithographic printing plates and electronic parts. The invention relates further to the manufacture of such precursors, and to their use in making articles such as lithographic printing plates, electronic parts and masks.

BACKGROUND OF THE INVENTION

A generally used type of lithographic printing plate precursor has a radiation sensitive coating applied to an aluminum substrate. A positive working precursor has a radiation sensitive coating, which after imagewise exposure to radiation of a suitable wavelength becomes more soluble in the exposed areas than in the non-exposed areas, in a developer. Only the remaining, image, area of the coating is ink-receptive.

The differentiation between image and non-image areas is made in the exposure process where a film is applied to the printing plate precursor with a vacuum to ensure good contact. The printing plate precursor is then exposed to a radiation source; conventionally this has been a UV radiation source. In the case where a positive printing plate precursor is used, the area of the film that corresponds to the image in the printing plate precursor is opaque so that no light will strike the printing plate precursor, whereas the area on the film that corresponds to the non-image area is clear and permits the transmission of light to the coating which becomes more soluble and is removed on development.

In the manufacture of electronic parts such as printed circuits, after exposure to radiation and development, the resist pattern is used as a mask for forming the patterns onto the underlying electronic elements—for example by etching an underlying copper foil. Due to the high resolution demands and the requirements of high resistance to etching techniques, positive-working systems are widely used. In particular, in the main there have been used alkali developable positive working resists mainly composed of alkali-soluble novolac resins.

The types of electronic parts whose manufacture may use a resist include printed wiring boards (PWBs), thick- and thin-film circuits, comprising passive elements such as resistors, capacitors and inductors; multichip devices (MDCs); and integrated circuits (ICs). These are all classified as printed circuits.

Imagable compositions may also be applied to plastics films in order to form masks. The required pattern is formed on the mask, which is then used as a screen in a later processing step, in forming a pattern on, for example, a printing plate or electronic part precursor.

Common to virtually all commercial applications of positive working systems employing UV radiation over several decades have been compositions comprising alkali soluble phenolic resins and naphthoquinone diazide (NQD) derivatives. The NQD derivatives have been simple NQD compounds used in admixture with resins, or NQD resin esters in which the photoactive NQD moiety has been chemically attached to the resin itself, for example by esterification of the resin with an NQD sulphonyl chloride.

As demands on the performance of UV sensitive positive working coatings have increased so NQD technology has become limiting. In addition, digital and laser imaging technology is making new demands on coatings.

We have devised new positive working heat sensitive systems, to meet the new demands. Our new systems and methods are the subject of our patent applications WO 97/39894, WO 99/01796, WO 99/01795, WO 99/08879, WO 99/21715, WO 99/21725 and WO 99/11458 which are hereby incorporated by reference in their entirety. Heat is delivered to the coatings described by conduction, using a heated body such as a stylus, or by charged particle radiation, or, preferably, by means of infra-red radiation, the coatings then containing suitable infra-red absorbers.

Our new systems are very effective and are in production, and proving very successful in the marketplace, but it would be desirable to improve them further, by making their coatings more resistant to the effects of movement; for example within the manufacturing plant; during transportation from the manufacturing plant to a customer's site; and within the customer's site. One example of a source of problems in the customer's site is at the image setter. This will often have linear conveying equipment to convey a precursor into and out of the image setter, and this can leave markings in the travel direction, and/or it may have lifting equipment which can leave markings caused by elastomeric lifting disks.

It is an object of the invention to provide articles having coatings which may be imaged by heat, the articles having good resistance to the effects of movement, especially caused by mechanical handling equipment, notably such equipment used by printers and printed circuit board manufacturers.

SUMMARY OF THE INVENTION

We have devised technology which offers improvement of our new systems mentioned above, such that their coatings continue to show good develop ability, with heated areas dissolving in aqueous developers and with unheated areas remaining insoluble in such developers, but wherein the coatings have improved mechanical properties.

In accordance with a first aspect of the invention there is provided a positive working heat imagable lithographic precursor comprising a substrate and a polymeric coating thereon, wherein all of the polymeric coating thereon is in a single layer applied to the substrate by application of an organic solvent containing the polymeric material of the polymeric coating, and removal of the organic solvent, wherein the coating comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions.

In accordance with a second aspect of the invention there is provided a positive working heat imagable lithographic precursor comprising a substrate and a polymeric coating thereon, wherein the polymeric coating thereon is provided in more than one layer, wherein one layer of the coating, not being the outer layer, is formed by application of an organic solvent containing the polymeric material of that layer, and removal of the organic solvent, wherein that layer comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions.

Preferably the polymeric particles are such that the coating containing them has improved mechanical properties, compared with a corresponding coating with no such particles (that is, in which the weight proportion which would have been constituted by the polymeric particles is instead constituted by the same weight of matrix material). Preferably the coating containing polymeric particles has improved resistance to mechanical handling equipment used in the manufacture and/or use of lithographic plate precursors and/or plates.

DETAILED DESCRIPTION OF THE INVENTION

Figure 1:
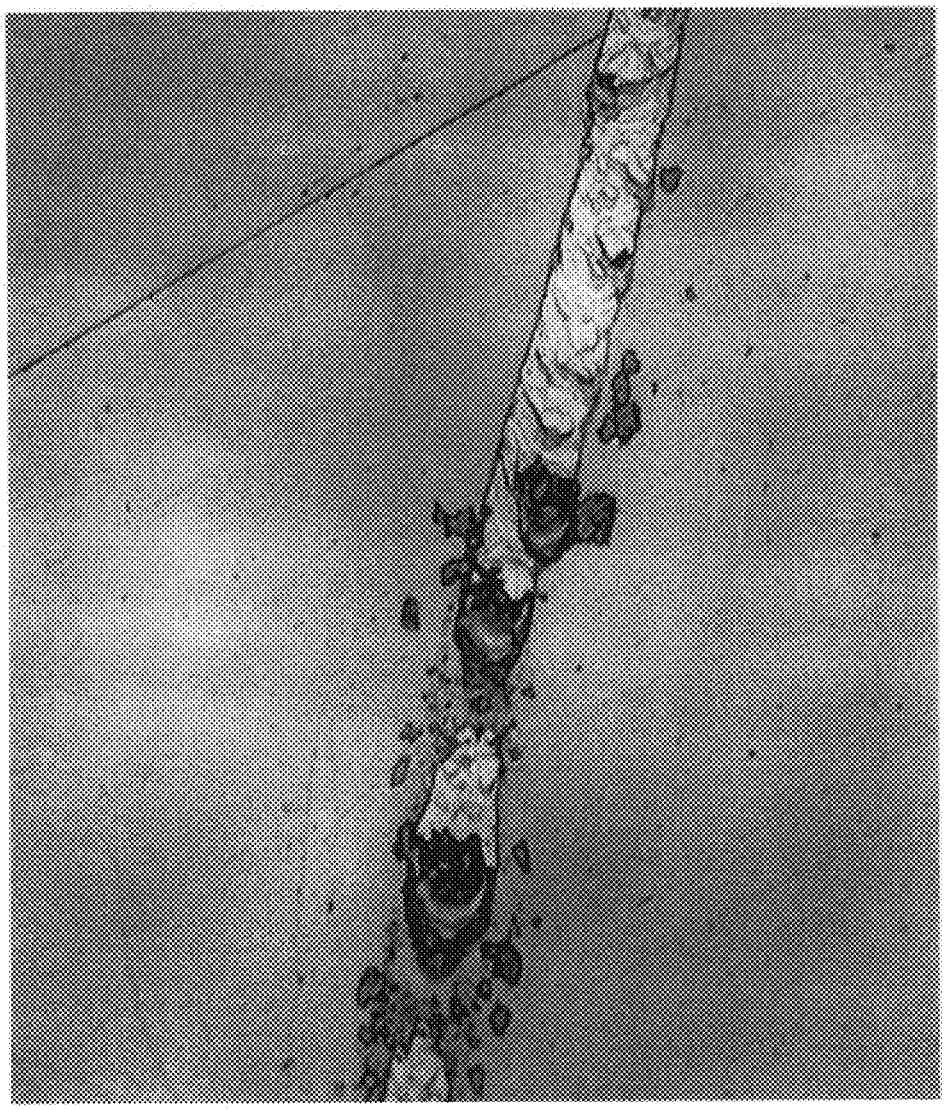
FIG. 1 illustrates a micrograph showing the scratch resistance test result for a substrate Coating (see example 18).

Suitably the polymeric matrix material comprises one or more materials selected from a polymer or copolymer of styrene, a polymer or copolymer of hydroxystyrene, notably of 4-hydroxystyrene or 3-methyl-4-hydroxystyrene, a polymer or copolymer of an alkoxystyrene, notably of 4-methoxystyrene, a polymer or copolymer of acrylic acid, a polymer or copolymer of methacrylic acid, a polymer or copolymer of acrylonitrile, a polymer or copolymer of acrylamide, a polymer or copolymer of vinyl alcohol, an acrylate polymer or copolymer, a polymer or copolymer of methacrylamide, a sulphonamido or imido polymer or copolymer, a polymer or copolymer of maleiimide or of alkylmaleiimide or of dialkylmaleiimide, a polymer or copolymer of maleic anhydride (including partially hydrolysed forms), a hydroxycellulose, a carboxy cellulose and a phenolic resin. Preferably the polymeric matrix material comprises a phenolic resin, especially a novolac resin. Blends of such materials may, of course, be employed in the polymeric matrix material.

Particularly useful phenolic resins in this invention are condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde and/or ketones for example acetone. Dependent on the preparation route for the condensation a range of phenolic materials with varying structures and properties can be formed. Particularly useful in this invention are novolac resins, resole resins and novolac/resole resin mixtures. Most preferred are novolac resins. The type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is used to prepare novolac resins.

Examples of suitable novolac resins have the following general structure

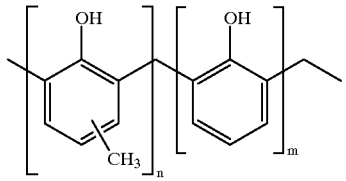

Suitably the polymeric particles constitute at least 0.25%, preferably at least 0.5%, more preferably at least 1%, yet more preferably at least 2%, most preferably at least 5%, and, especially, at least 7%, by weight of the coating.

Suitably the polymeric particles constitute up to 50%, preferably up to 40%, more preferably up to 30%, yet more preferably up to 25%, most preferably up to 20%, and, especially, up to 14%, by weight of the coating.

In this specification weight percentages are expressed with reference to the solid coating without the organic solvent.

Preferably the mean diameter of the polymeric particles is in the range 0.5–15 micrometers, preferably 1–10 micrometers, especially 3–7 micrometers, as determined visually by an operator using scanning electron microscopy and a scale. Preferably the mean diameter of the polymeric particles, as thus measured, is larger than the mean thickness of the coating. Whilst we are not bound by any theory as to how the invention works we believe that the presence of the particles may have a stress relieving effect and/or facilitate crack termination; and/or that they protrude from the surface and are the parts contacted by objects, and thus may protect the rest of the coating from contact with objects.

An important factor is also believed to be the surface tension at the interfaces between the particles and the matrix material.

Preferred particles for use in the present invention are those which are evenly dispersed in the coating, and which have relatively low critical surface tension ($\gamma_c$). Critical surface tension ($\gamma_c$) is discussed in Principles of Polymer Science, $3^{rd}$ edition, Ferdinand Rodriguez, ISBN 0891161767 at pages 367–370. Figures given herein are measured by the standard test described therein at 20° C.

Preferably the particles are of a material which has a $\gamma_c$ value of less than 50 milli-Nm$^{-1}$, preferably less than 40, more preferably less than 35, and, especially, less than 25. Most preferred of all is a $\gamma_c$ value of less than 20.

Preferably the polymeric particles are selected from optionally substituted polyolefin, polyamide and polyacrylic particles. More preferably they are selected from polyolefins and halogenated, especially fluorinated, polyolefins. Polyethylene and polytetrafluoroethylene particles ($\gamma_c$ values typically about 31 milli-Nm$^{-1}$ and about 18.5 respectively) are especially preferred.

The precursor may comprise an absorber compound which absorbs incident radiation in the wavelength range 600–1400 nm and converts it to heat.

A large number of compounds, or combinations thereof, can be utilized as radiation absorbing compounds in preferred embodiments of the present invention.

The radiation absorbing compound may usefully be a pigment, which is a black body or broad band absorber. It may be carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

The radiation absorbing compound may usefully be an infra-red absorbing dye able to absorb the radiation selected for imaging and convert it to heat.

Preferably the infra-red absorbing compound is one whose absorption spectrum is significant at the wavelength output of the laser which is (in preferred embodiments) to be used in the method of the present invention. Usefully it may be an organic pigment or dye such as phthalocyanine pigment. Or it may be a dye or pigment of the squarylium, merocyanine, cyanine, indolizine, pyrylium or metal dithioline classes.

Suitably the radiation absorbing compound, when present, constitutes at least 0.25%, preferably at least 0.5%, more preferably at least 1%, most preferably at least 2%, of the total weight of the coating. Suitably the radiation absorbing compound, when present, constitutes up to 25%, preferably up to 20%, and most preferably up to 15%, of the total weight of the coating. There may be more than one radiation absorbing compound. References herein to the proportion of such compound(s) are to their total content.

The coating may comprise one or more insolubilizer(s) to confer on the coating the property that unheated regions of the coating have reduced solubility in an aqueous developer, compared with a corresponding coating without the insolubilizer(s). In a coating having more than one layer the insolubilizer(s) may be in the layer containing said particles or it may be in a different layer, for example the outer layer.

Said insolubilizer(s) may be covalently bonded to a polymer of the composition or may be a compound which is not covalently bonded thereto.

Said insolubilizer(s) may be selected from:

functional groups as described in WO 99/01795.

separate reversible insolubilizer compounds, being diazide moieties as described in WO 99/01796.

separate reversible insolubilizer compounds, not being diazide moieties, and being as described in WO 97/39894, WO 99/08879, WO 99/21715 and WO 99/21725. Examples described include nitrogen-containing compounds wherein at least one nitrogen atom is either quaternized or incorporated in a heterocyclic ring; or quaternized and incorporated in a heterocyclic ring. Examples of useful quaternized nitrogen containing compounds are cationic triaryl methane dyes such as Crystal Violet (CI basic violet 3) and Ethyl Violet (CI Basic Violet 4). WO 97/39894 describes lithographic printing applications and WO 99/08879 describes electronic part applications of this technology. WO 99/21715 describes improvements to this technology brought about by use of a heat treatment carried out as part of the manufacture of articles bearing the composition. WO 99/21725 describes improvements to this technology brought about by the use of certain developer resistance aids, notably siloxane compounds.

Certain useful compositions of the present invention have the property that when provided as a coating on a substrate the solubility of the coating in an aqueous developer is not substantially increased by ambient ultraviolet radiation.

Certain preferred compositions of the present invention do not contain diazide moieties, especially quinonediazide moieties.

In certain compositions to which the present invention is applied heat imaging is believed to produce areas which have transient increased solubility in the developer. After an interval such areas may partially or wholly revert to their original, non-imaged level of solubility. Thus the mode of action of such preferred coatings does not require heat-induced lysis of the modifying means but, more likely, the break-up of a physico-chemical complex, which can re-form. Consequently, in such embodiments the precursor is contacted with a developer within a time period of 20 hours or less of the exposure to imaging heat, preferably within about 120 minutes of exposure, and most preferably within 5 minutes of exposure.

An especially preferred composition of the present invention thus has an infra-red absorbing compound to convert infra-red radiation to heat and a said separate reversible insolubilizer compound as described in WO 97/39894 or WO 99/08879; or an infra-red absorbing compound which converts infra-red radiation to heat and which also functions as a reversible insolubilizer compound; for example a cyanine dye having both such characteristics.

Suitably a reversible insolubilizer compound, when present (whether or not also acting as a radiation absorbing compound) constitutes at least 0.25%, preferably at least 0.5%, more preferably at least 1%, and most preferably at least 2%; and preferably up to 15%, more preferably up to 25%, of the total weight of the composition. There may be more than one reversible insolubilizer compound. References herein to the proportion of such compound(s) are to their total content.

Suitably the composition contains a developer resistance means as defined in WO 99/21725, suitably a siloxane, preferably constituting 1–10 wt % of the composition. Preferred siloxanes are substituted by one or more optionally-substituted alkyl or phenyl groups, and most preferably are phenylalkylsiloxanes and dialkylsiloxanes. Preferred siloxanes have between 10 and 100 —Si($R^1$)($R^2$)O— repeat units. The siloxanes may be copolymerised with ethylene oxide and/or propylene oxide. For further information on preferred siloxanes the definitions in WO 99/21725 may be recited.

A coating present on a precursor of the invention may contain a carboxylic acid derivative of a cellulosic polymer, in order to increase its chemical resistance. In a precursor of the present invention having a multi-layer coating such a polymer is preferably present in the outer layer.

The presence of the carboxylic acid derivative of a cellulosic polymer appears to confer upon the compositions improved resistance to certain organic liquids, for example petroleum ethers, alkanediols, for example hexanediol, other glycols, glycol ethers, straight-chain alkanols, for example ethanol, branched alkanols, for example isopropanol and 1-methoxypropan-2-ol, cycloalkanols, for example cyclohexanol, and beta-ketoalkanols, for example diacetone alcohol (ie 4-hydroxy-4-methyl-2-pentanone). When we refer herein to a composition or coating as being resistant to organic liquids we are referring to a composition or coating which is preferably resistant to organic liquids of at least one of these classes (ie petroleum ethers; glycols and glycol ethers; and alkanols); more preferably to organic liquids of at least two of them; and most preferably to organic liquids of all three of them.

Suitably the carboxylic acid derivative of a cellulosic polymer provides at least 0.25%, preferably at least 0.5%, more preferably at least 1%, yet more preferably at least 2%, most preferably at least 5%, and, especially, at least 8%, of the weight of the coating.

Suitably the carboxylic acid derivative of a cellulosic polymer provides up to 50%, preferably up to 30%, more preferably up to 20%, still more preferably up to 16%, and most preferably up to 12%, of the weight of the coating.

Preferably the acid number of the carboxylic acid derivative of the cellulosic polymer is at least 50, more preferably at least 80, most preferably at least 100.

Preferably the acid number of the carboxylic acid derivative of the cellulosic polymer does not exceed 210, and preferably does not exceed 180.

"Acid number" is the number of milligrams of potassium hydroxide needed to neutralize 1 gram of the acidic compound.

Said carboxylic acid derivative of a cellulosic polymer may be a carboxylic acid derivative of a cellulose alkanoate, especially of a cellulose acetate.

The carboxylic acid derivative of a cellulosic polymer may be a reaction product of a cellulosic polymer and of a carboxylic acid or, especially, of an acid anhydride thereof. The carboxylic acids and acid anhydrides may be defined by the formulae

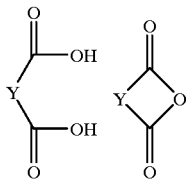

Y is suitably of the formula

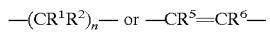

where n represents an integer from 1 to 6, $R^1$ independently represents a hydrogen atom or an alkyl group (and when n is greater than 1 the groups $R^1$ need not be identical with each other), $R^2$ represents a hydrogen atom or an alkyl group (and when n is greater than 1 the groups $R^2$ need not be identical with each other), $R^5$ represents a hydrogen atom or an alkyl group, $R^6$ represents a hydrogen atom or an alkyl group, or $R^5$ and $R^6$ together represent a chain such that the group —$CR^5$=$CR^6$— is an optionally substituted aryl or heteroaryl group.

Any alkyl group is suitably a $C_{1-6}$ alkyl group, preferably a $C_{1-4}$ alkyl group, and, most preferably, a methyl group.

An optionally substituted aryl group may be an optionally substituted naphthyl or, preferably, an optionally substituted phenyl group (such that the relevant anhydride is phthalic anhydride).

An optionally substituted heteroaryl group may suitably comprise 5 or 6 ring atoms of which 1 or more, preferably 1 or 2, are hetero atoms selected from oxygen, sulphur or nitrogen. Preferred heteroaryl groups have 1 oxygen atom; or 1 sulphur atom; or 1 or 2 nitrogen atoms.

Optional substituents of an aryl or heteroaryl group may suitably be selected from halogen atoms, and from $C_{1-4}$ alkyl, $C_{1-4}$ haloalkyl, cyano, $C_{1-4}$ alkoxy and carboxylic acid groups. There may suitably be 1–3 substituents but preferred aryl or heteroaryl groups are unsubstituted.

Most preferably Y is selected from the following groups:

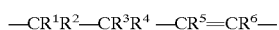

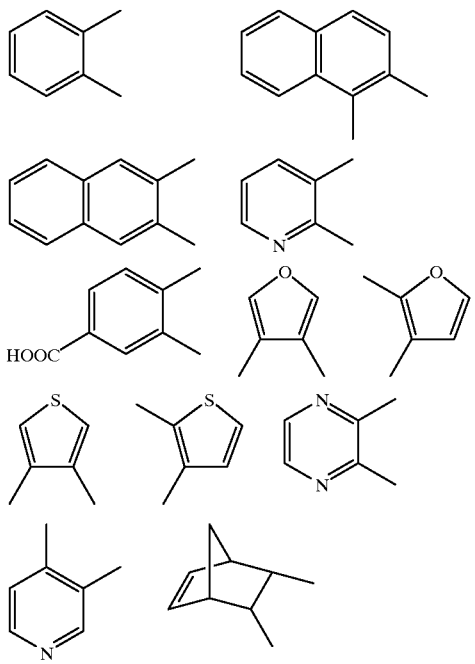

wherein each of $R^1$, $R^2$, $R^3$, $R^4$, $R^5$ and $R^6$ independently represents a hydrogen atom or an alkyl group.

Particularly preferred carboxylic acid derivatives of a cellulosic polymer are the materials commercially available under the names CAP (cellulose acetate phthalate), CAHP (cellulose acetate hydrogen phthalate—CAS No 9004-38-0) and CAT (cellulose acetate trimellitate—CAS No 52907-01-4). Cellulose acetate propionate (CAS No 9004-39-1) and cellulose acetate butyrate (CAS No 9004-36-8) are also commercially available and may be useful.

In the present invention there is a requirement that the cellulosic polymer has carboxylic acid functionality but it may have further functional groups, for example hydroxyl groups or alkoxy groups, or groups containing an amide functionality.

The coatings of the precursors of the invention may contain other ingredients such as stabilising additives, inert colorants, and additional inert polymeric binders as are present in many positive working coatings.

After the removal of the organic solvent the precursor may be subjected, as part of its manufacture, to a stabilizing heat treatment step. We favor carrying out the heat treatment at a temperature of at least 40° C., preferably at least 45° C., most preferably at least 50° C. As regards the upper limit, we favor using a temperature not in excess of 90° C., preferably not in excess of 85° C., most preferably not in excess of 60° C. In general, heat treatments in which the maximum temperature does not exceed the glass transition temperature (Tg) of the composition (as measured by differential scanning calorimetry (DSC) at a heating rate of 10° C./minute) are favored. Such heat treatments are suitably carried out on a stack of precursors or on a precursor coil, and so are efficient.

We favor carrying out such a heat treatment for at least 4 hours; and preferably for at least 24 hours and most preferably for at least 48 hours.

Preferably such a heat treatment takes place under conditions which inhibit the removal of water from the precursor, for example by wrapping the precursor (or preferably a stack or coil thereof) in a water impermeable material and/or by using humidity control. For further information on such heat treatments WO 99/21715 can be referred to.

A substrate may comprise a metal layer. Preferred metals include aluminum, zinc, copper and titanium.

A substrate in embodiments of the invention intended as printing plate precursors may be arranged to be non-ink-accepting. Said substrate may have a hydrophilic surface for use in conventional lithographic printing using a fount solution or it may have an ink-repelling surface suitable for use in waterless printing.

For printing applications the substrate may be aluminum which has undergone the usual graining anodic, and post-anodic treatments well known in the lithographic art for enabling a radiation sensitive composition to be coated thereon and for its surface to function as a printing background. Another substrate which may be used in the present invention in the context of lithography is a plastics material base or a treated paper base as used in the photographic industry. A particularly useful plastics material base is polyethylene terephathlate which has been subbed to render its surface hydrophilic. Also a so-called coated paper which has been corona discharge treated can be used.

Preferred printing plates have a substrate which has a hydrophilic surface and an oleophilic ink-accepting coating.

For electronic part applications the substrate may comprise a copper sheet, for example a copper/plastics laminate. After imaging and development an etching agent may be used to remove exposed metal regions, leaving, for example, a printed circuit.

For certain mask applications the substrate may be a plastics film.

Thus a positive working pattern may be obtained after patternwise exposure and development of a precursor of the present invention. The developer solubility of the coating after it has been subjected to heat during patternwise exposure is greater than the solubility of the corresponding unexposed coating. In preferred embodiments this solubility differential is increased by means of additional components and/or by resin modification, as described herein, and in our earlier patent applications which are referred to. Preferably such measures reduce the solubility of the polymeric composition, prior to the patternwise exposure. On subsequent patternwise exposure the exposed areas of the coating are rendered more soluble in the developer, than the unexposed areas. Therefore on patternwise exposure there is a change in the solubility differential of the unexposed coating and of the exposed coating. Thus in the exposed areas the coating is dissolved, to form the pattern.

The coated precursor of the invention may in use be patternwise heated indirectly by exposure to a short duration of high intensity radiation transmitted or reflected from the background areas of a graphic original located in contact with the recording material.

The developer is dependent on the nature of the coating, but is preferably an aqueous developer. Common components of aqueous developers are surfactants, chelating agents such as salts of ethylenediamine tetraacetic acid, organic solvents such as benzyl alcohol and phenoxy ethanol, phosphates, and alkaline components such as inorganic metasilicates, hydroxides and bicarbonates, and mixtures of the foregoing.

Suitably, the polymeric material per se used in the coating (not including the particles) is inherently soluble in an alkaline developer. Suitably it is rendered insoluble in an alkaline developer by means of one or more insolubilizer(s). Preferably in use, provided as a coating, it is more soluble in an alkaline developer than it is in neutral liquids, such as water. Certain useful coatings may be substantially insoluble in neutral liquids, such as water.

Preferably an aqueous developer is an alkaline developer containing one or more inorganic or organic metasilicates.

In the specification when we state that a coating is developer soluble we mean that it is soluble in a selected developer, to an extent useful in a practical development process. When we state that a coating is developer insoluble we mean that it is not soluble in the selected developer, to an extent useful in a practical development process.

In accordance with a third aspect of the invention there is provided a method of manufacturing a precursor of the first or second aspect of the invention, comprising the following steps carried out in the order stated:

(a) making a liquid composition comprising the organic solvent, the polymeric matrix material dissolved therein, and the polymeric particles dispersed therein;

(b) applying said liquid composition to the substrate; and (c) removing the organic solvent.

Preferably, a stabilizing heat treatment step, as defined above, is carried out subsequent to step (c).

In accordance with a fourth aspect of the invention there is provided a method for preparing a lithographic printing plate, mask or electronic part from a precursor of the first or second aspect, the method comprising the steps of (i) heating the coating imagewise; and (ii) removing the heated regions of the coating using said aqueous developer.

The heating of selected areas is preferably effected by the use of infra-red electromagnetic radiation, suitably in the range 600–1200nm, the coating preferably containing a radiation absorbing compound as defined above, or a radiation absorbing compound being provided as a separate layer. Alternatively charged particle radiation could be used to deliver heat. Alternatively heat could be delivered directly, by a heated body applied to the coating or to the reverse face of the substrate. In this case no radiation absorbing compound is needed.

In preferred methods the electromagnetic radiation is employed. Preferably the radiation is of wavelength at least 650 nm, preferably at least 700 nm, and more preferably at least 750 nm. Most preferably it is at least 800 nm. Suitably the radiation is of wavelength not more than 1350 nm, preferably not more than 1300 nm, more preferably not more than 1200 nm, and most preferably not more than 1150 nm.

The radiation may be delivered by a laser under digital control. Examples of lasers which can be used to expose coatings suitable for the method of the present invention include semiconductor diode lasers emitting at between 600 nm and 1400 nm, especially between 700 nm and 1200 nm. One example is the Nd YAG laser which emits at 1064 nm and another is the diode laser used in the Creo Trendsetter thermal image setter, which emits at 830 nm, but any laser of sufficient imaging power and whose radiation is absorbed by the coating to produce heat, can be used.

In accordance with a fifth aspect of the present invention there is provided an article prepared by a method of the fourth aspect of the invention.

In accordance with a sixth aspect of the present invention there is provided a positive working heat imagable lithographic precursor comprising a substrate and a polymeric coating thereon, wherein the polymeric coating thereon is provided in more than one layer, wherein one layer of the coating, not being the outer layer, is formed by application of an organic solvent containing the polymeric material of that layer and removal of the organic solvent, wherein that layer comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions.

In accordance with a seventh aspect of the present invention there is provided a method of preparing a lithographic printing plate, mask or electronic part from a precursor as defined above, the method comprising the steps of
(i) heating the coating imagewise; and
(ii) removing the heated regions of the coating using said aqueous developer.

In accordance with an eighth aspect of the present invention there is provided a positive working heat imagable printing plate precursor or electronic part precursor or mask precursor, comprising a substrate and a polymeric coating thereon, wherein all of the polymeric coating thereon is in a single layer applied to the substrate by application of an organic solvent containing the polymeric material of the polymeric coating, and removal of the organic solvent, wherein the coating comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the layer are selectively removed by the aqueous developer leaving behind unheated regions; wherein the coating has improved mechanical properties, compared with a corresponding coating with no such particles.

In accordance with a ninth aspect of the present invention there is provided a method of improving the mechanical properties of a coating provided on a heat imagable printing plate precursor or electronic part precursor or mask precursor, the precursor comprising a substrate and a polymeric coating thereon, wherein all of the polymeric coating thereon is in a single layer applied to the substrate by application of an organic solvent containing the polymeric material of the polymeric coating, and removal of the organic solvent, wherein the coating comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the layer are selectively removed by the aqueous developer leaving behind unheated regions; wherein the coating has improved mechanical properties, compared with a corresponding coating with no such particles.

In accordance with a tenth aspect of the present invention there is provided a positive working heat imagable lithographic precursor comprising a substrate and a polymeric coating thereon, wherein the polymeric coating thereon is provided in more than one layer, wherein one layer of the coating, not being the outer layer, is formed by application of an organic solvent containing the polymeric material of that layer, and removal of the organic solvent, wherein that layer comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions; preferably wherein the coating has improved mechanical properties, compared with a corresponding coating with no such particles.

In accordance with an eleventh aspect of the present invention there is provided a method of improving the mechanical properties of a coating provided on a heat imagable printing plate precursor or electronic part precursor or mask precursor, the precursor comprising a substrate a polymeric coating thereon, wherein the polymeric coating thereon is provided in more than one layer, wherein one layer of the coating, not being the outer layer, is formed by application of an organic solvent containing the polymeric material layer and removal of the organic solvent, wherein that same layer comprises a polymeric matrix material and polymeric particles therein wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions; preferably wherein the coating has improved mechanical properties, compared with a corresponding coating with no such particles.

It will be apparent that the present invention is connected to previous inventions we have made and the content of the following patent applications is hereby incorporated by reference in their entirety:

WO 97/39894, WO 99/01795, WO 99/01796, WO 99/21715, WO 99/21725, WO 99/08879 and WO 99/11458.

The following examples more particularly serve to illustrate the present invention described hereinabove. These examples are not intended to limit the invention in any way. One of ordinary skill in the art can propose numerous modifications based on the teachings herein, all of which are encompassed by this invention. In these examples the following products were used:

LB6564—a phenol/cresol novolak resin marketed by Bakelite, UK, and believed to have the structure:

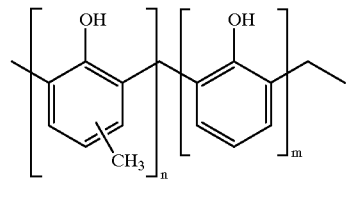

$n = m$

LB 744—a cresol novolak resin marketed by Bakelite, UK, and believed to have the structure:

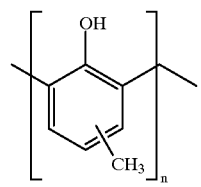

KF654B PINA as supplied by Allied Signal, Middlesex, UK, and believed to have the structure:

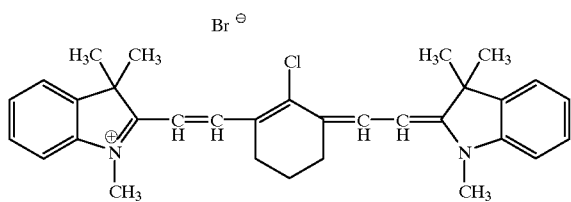

Crystal violet (basic violet 3, C.I. 42555, Gentian Violet) as supplied by Aldrich Chemical Company of Dorset, UK, and believed to have the structure:

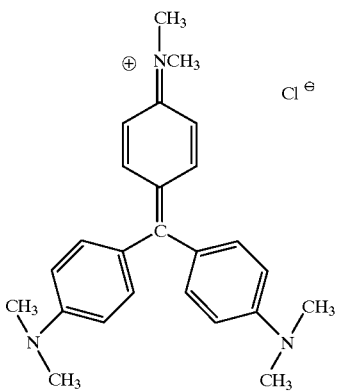

Silikophen P50X: a phenyl methyl siloxane as supplied by Tego Chemie Service GmbH of Essen, Germany.
COMBIFIX and SUBSTIFIX—standard "alcohol replacement" fount solution additives, each comprising surfactants, and available from Horstmann-Steinberg of Germany. Printers add them, and similar products, to fount solutions in order to keep the substrate ink free, to soften the water and to aid ink dispersion over the surface of the lithographic precursor.
Particles A: Fluoroslip 525: a polyethylene/polytetrafluoroethylene powder as supplied by Blagden Chemicals of Westerham, Kent, UK.
Particles B: Shamrock SST-3D: a polytetrafluoroethylene powder as supplied by Blagden Chemicals.
Particles C: Shamrock SST-4: a polytetrafluoroethylene powder as supplied by Blagden Chemicals.
Particles D: Shamrock S-395-N5: a high molecular weight polyethylene powder as supplied by Blagden Chemicals.
Particles E: Orgasol 2001 UD NAT 2: a polyamide resin as supplied by ELF Atochem UK, LTD, of Newbury, Berkshire,UK.
Aluminum Substrate A: 0.3 mm aluminum sheet that has been electrograined in hydrochloric acid, then anodised, and then treated with an aqueous solution of an inorganic phosphate.
Polyester Substrate A: 0.18 mm polyester film as supplied under the trade mark PLANFOIL by Kodak Polychrome Graphics, Leeds, UK.
Developer A: 14 wt % sodium metasilicate pentahydrate in water.
Gretag Densitometer: a Gretag D 19C densitometer available from Colour Data Systems Limited, the Wirral, UK, and used to compare actual screen densities with expected screen densities.
DUR-O-Test: a scratch testing instrument manufactured by BYK Gardner GMBH of Geretsried, Germany. The instrument consists of a sleeve containing a pressure spring than can be compressed to various tensions by means of a slide. This spring acts upon a protruding tungsten carbide needle. The spring can be replaced in order to change the force available
Heidelberg Speedmaster: a Heidelberg Speedmaster 52 printing press available from Heidelberg Graphic Equipment of Leeds, UK.
Mercury Processor: a commercially available processor as supplied by Kodak Polychrome Graphics, Leeds, UK under the trade mark KODAK POLYCHROME GRAPHICS MERCURY MARK V, model 850.
Mathis Labdryer: a Mathis Labdryer oven as supplied by Werner Mathis AG, Germany.
Sanyo Gallenkamp: a Sanyo Gallenkamp environmental chamber, model number HCC019.PF1.F as supplied by Sanyo Gallenkamp of Leicester, UK.
Creo Trendsetter 3244 AL: a commercially available plate setter, operating at a wavelength of 830 nm and supplied by Creo Products of Burnaby, Canada. The plate setter has an automatic plate loading and unloading apparatus. Unexposed plate precursors are loaded into a cassette. The plate precursors are transported from the cassette onto the drum of the plate setter by means of rubber air-driven elastomeric lifting disks, which attach to the precursor surface and drive it onto the imaging drum. The same elastomeric lifting disks remove the plate precursor and place it on a conveyor, which feeds it into the developing processor.

In the experiments described below, all of the imaging and development tests were carried out on precursors having Aluminum Substrate A, and all of the scratch tests were carried out on Polyester Substrate A.

EXAMPLES 1 AND 2

Coating formulations for Examples 1 and 2 shown in the table below were prepared as solutions in 1-methoxypropan-2-ol:xylene (98:2, vol:vol). The particles were blended into the solvent in a high shear mixer for 1 minute. Then, the composition was kept mobile until use by gentle turning (1 revolution every 2 seconds) on a standard barrel roller. The coating solutions were coated onto Aluminum Substrate A by means of a wire wound bar. The solution concentrations were selected to provide the specified dry film compositions with a coating weight of 2.0 $gm^{-2}$ for Example 1 and 2.2 $gm^{-2}$ for Example 2 after thorough drying at 110° C. for 90 seconds in the Mathis Labdryer oven.

|  | Example 1 | Example 2 |
| --- | --- | --- |
| Resin A | 70 | 63 |
| Resin B | 20 | 18 |
| Dye A | 2 | 1.8 |
| Dye B | 2 | 1.8 |
| Silikophen P50X | 6 | 5.4 |
| Particle B | 0 | 10 |

The plate precursors were heat treated at 55° C. for 72 hours in the Sanyo Gallenkamp oven. All samples were stacked with interleaving (a polythene coated paper, number 22, 6 $gm^{-2}$ available from Samuel Grant, Leeds, UK), and an additional 10 blank precursors were put on top and underneath the stack before wrapping the whole stack in paper and sealing with tape.

After cooling, the precursors were imaged on the Creo Trendsetter 3244 AL with an imaging energy of 200 $mJcm^{-2}$ with a 50% checkerboard image, using the load/unload mechanism, and were subsequently developed in the Mercury Processor under conditions described in the table below.

The plates were then inspected visually for evidence of plate coating damage caused specifically by the rubber elastomeric lifting disks of the Creo Trendsetter load/unload apparatus. Ranking of the damage was made from 0 (no damage) to 7 (clear, visible, permanent coating damage), and these rankings are set out in the table below.

|  | Example 1 | Example 2 |
|---|---|---|
| Developer A temperature = 25.7° C., processing speed 500 mm/min, 1 day old developer | 4 | 0 |
| Developer A temperature = 25.7° C., processing speed 500 mm/min, 3 day old developer | 6 | 1 |
| Developer A temperature = 24.3° C., processing speed 500 mm/min, 3 day old developer | 5 | 1 |
| Developer A temperature = 22.3° C., processing speed 500 mm/min, 3 day old developer | 3 | 0 |

EXAMPLES 3 (Comparative), 4 AND 5

In the examples the experimental work was as described in Examples 1 and 2 but the Mercury Processor containing Developer A at 22.5° C. was set at a speed of 750 mm/min; and elastomeric lifting disk marking was not measured. Instead further properties were assessed, as described below. The formulations were as follows.

| Material | Example 3 | Example 4 | Example 5 |
|---|---|---|---|
| LB6564 | 70 | 63 | 63 |
| LB744 | 20 | 18 | 18 |
| Silikophen P50X | 6 | 5.4 | 5.4 |
| KF654B PINA | 2 | 1.8 | 1.8 |
| Crystal Violet | 2 | 1.8 | 1.8 |
| Particles C | 0 | 10 | 0 |
| Particles D | 0 | 0 | 10 |
| Film weight gm$^{-2}$ | 2.0 | 2.2 | 2.2 |

Sensitivity 2 to 95% dots were measured on the coated Aluminum Substrate A samples, with the Gretag Desintometer. The results are given in the following table.

| % Dot | Example 3 | Example 4 | Example 5 |
|---|---|---|---|
| 2 | 2 | 2 | 2 |
| 5 | 5 | 5 | 4 |
| 10 | 10 | 10 | 9 |
| 20 | 20 | 19 | 17 |
| 30 | 30 | 29 | 28 |
| 40 | 39 | 39 | 38 |
| 50 | 50 | 50 | 48 |
| 60 | 61 | 60 | 59 |
| 70 | 71 | 71 | 70 |
| 80 | 82 | 81 | 81 |
| 90 | 92 | 92 | 91 |
| 95 | 97 | 97 | 96 |

EXAMPLES 6 (Comparative), 7 AND 8

Scratch Resistance

The coating solutions were formulated and coated exactly as for Examples 3–5 but using Polyester Substrate A; and no heat treatment was carried out. The coatings on the Polyester Substrate A were tested for scratch resistance using the DUR-O-Test instrument. For these tests the needle of the instrument was placed perpendicularly onto the coating. A line was drawn approximately 5 cm long within 1 second, whilst pressing the instrument against the coating until the plane jacket end contacted the test surface. If the substrate could be seen through the coating the specimen had failed the test and the force used was noted, but if a mark was made on the coating but did not break through the coating a pass was declared. For these tests the yellow spring supplied was used when a force of 0 to 300 cN was applied, and the red spring supplied was used when a force above 300 cN was applied.

The scratch tests showed that Examples 7 and 8 have good scratch resistance, scratches not being visible even at a force of 300 cN. In contrast, Example 6 had much worse scratch resistance, scratches being very clearly visible at a force of 300 cN and being quite easily visible at a force of 100 cN.

EXAMPLES 9 (Comparative), 10 (Comparative) AND 11

Example 9 was the same as Example 3, also at a coating weight of 2.0 gm$^{-2}$, on Aluminum Substrate A. Example 10 was the same as Example 3, but at a coating weight of 1.5 gm$^{-2}$. Example 11 was the same as Example 4, but at a coating weight of 1.65 gm$^{-2}$. Each printing plate precursor was imaged as above with the imaging energy adjusted so that the 2, 50, 70, 90 and 95% dots all read within 1% with the Gretag Densitometer. The plates were run on the Heidelberg Speedmaster press. At 115000 impressions, only the plate of Example 10 at 1.5 gm$^{-2}$ showed signs of wear.

EXAMPLES 12 (Comparative), 13–17

Coating formulations of Examples 12–17 described in the table below were prepared in 1-methoxypropan-2-ol:xylene (98:2, vol:vol), on Aluminum Substrate A. The coating solutions were coated onto Aluminum Substrate A by means of a wire wound bar. The coating solution concentrations were selected to give the specified dry film compositions with a coating weight of about 2.0 gm$^{-2}$, after drying at 110° C. for 90 seconds in the Mathis labdryer oven.

|  | Example 12 | Examples 13–17 |
|---|---|---|
| Resin A | 70 | 64 |
| Resin B | 20 | 18 |
| Dye A | 2 | 1.8 |
| Dye B | 2 | 1.8 |
| Silikophen P50X | 6 | 5.4 |
| Particles A to E respectively | 0 | 9 |

All the precursors were heat treated at 55° C. for 72 hours, as described above. All precursors were imaged on the Creo Trendsetter 3244 with an imaging density of 200 mJcm$^{-2}$ with a 50% dot screen, and were subsequently developed in the Mercury Processor using Developer A at 22.5° C. at a throughput speed of 750 mm/minute.

Plate imaging performance was assessed by visual comparison of the 50% screen of the examples to the comparative example 12 using an Olympus BX60F-3 microscope. The 50% dot images for Examples 13–16 appeared identical to that of the comparative example, but Example 17 was seen to have dots of coating retained on the substrate background.

EXAMPLES 18 (Comparative) AND 19–23

The formulations and coating method was exactly as described for Examples 12–17, except that the substrate was Polyester Substrate A, and no heat treatment was carried out.

The coatings on the Polyester Substrate A were tested for scratch resistance using the DUR-O-TEST instrument. The results are set out in the table below.

| Example | Force needed to Scratch (N) |
| --- | --- |
| 18 - (comparative) | 0.5 |
| 19 - Particles A | 20 |
| 20 - Particles B | 20 |
| 21 - Particles C | 20 |
| 22 - Particles D | 10–15 |
| 23 - Particles E | 20 |

Photomicrographs for the comparative example, Example 18, and for Examples 19 to 23, were taken using the Olympus BX60F-3 microscope connected to a JVC 3-CCD colour video camera, No. KY-F55B, using Image Pro Plus software available from Media Cybernetics of Maryland, US, a standard Pentium personal computer and an Epsom Stylus Colour 850 printer. These are digitally reproduced, respectively, as FIGS. 1 to 6 hereto.

Figure 2:
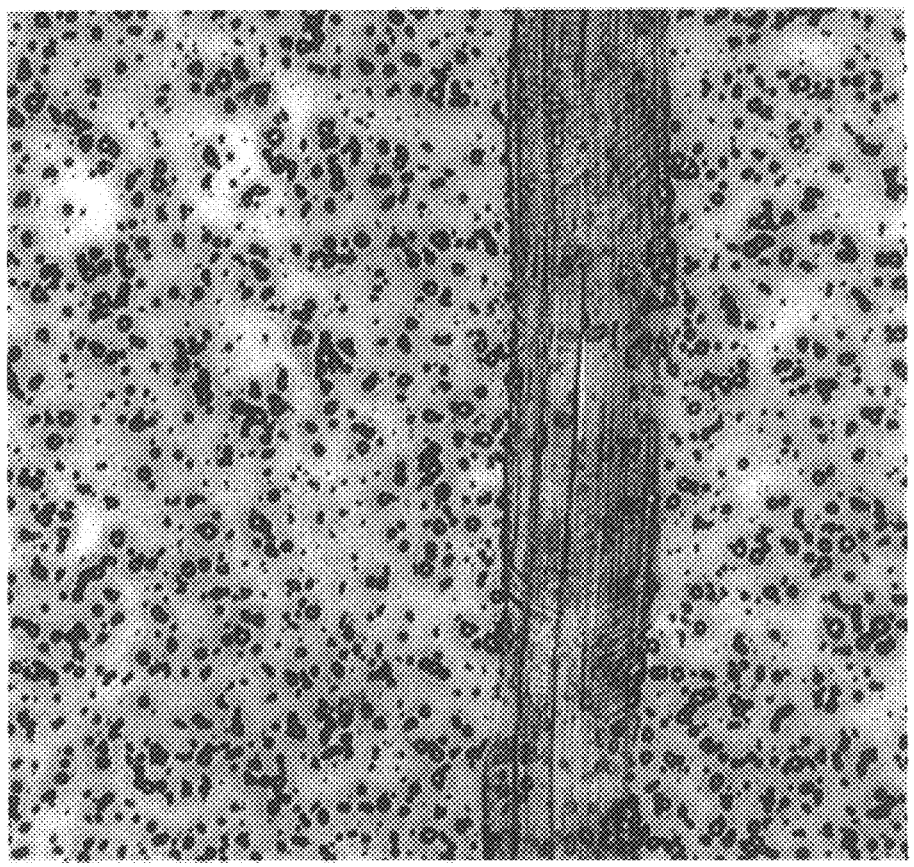
FIG. 2 illustrates a micrograph showing the scratch resistance test result for a substrate coating (see example 19).
Figure 3:
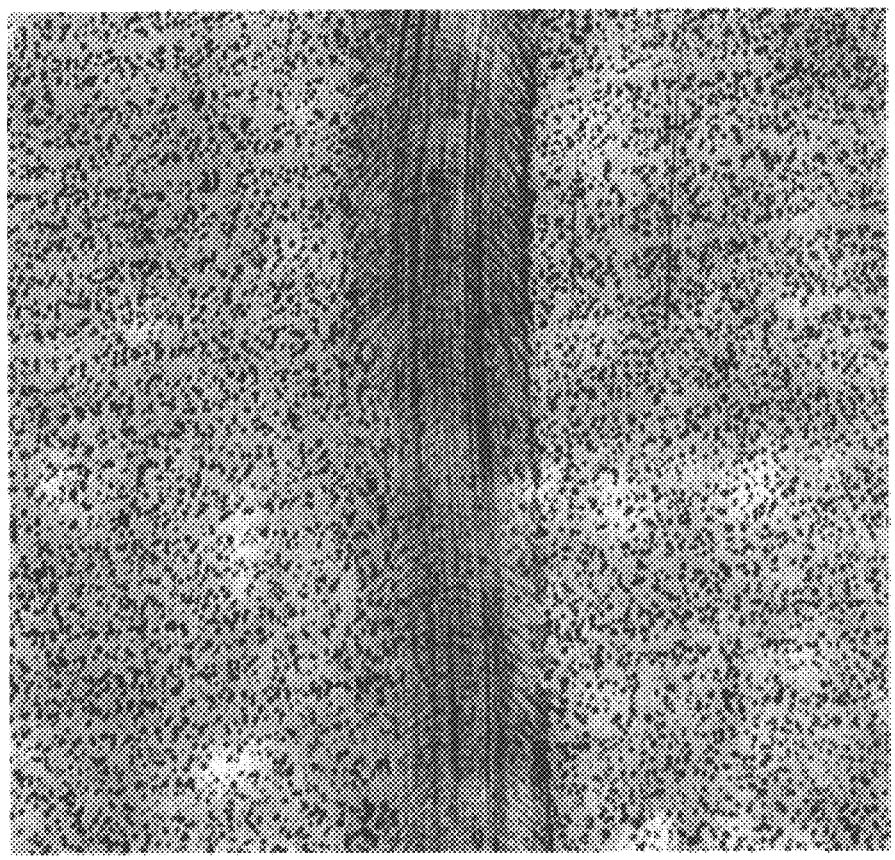
FIG. 3 illustrates a micro graph showing the scratch resistance test result for a substrate coating (see example 20.
Figure 4:
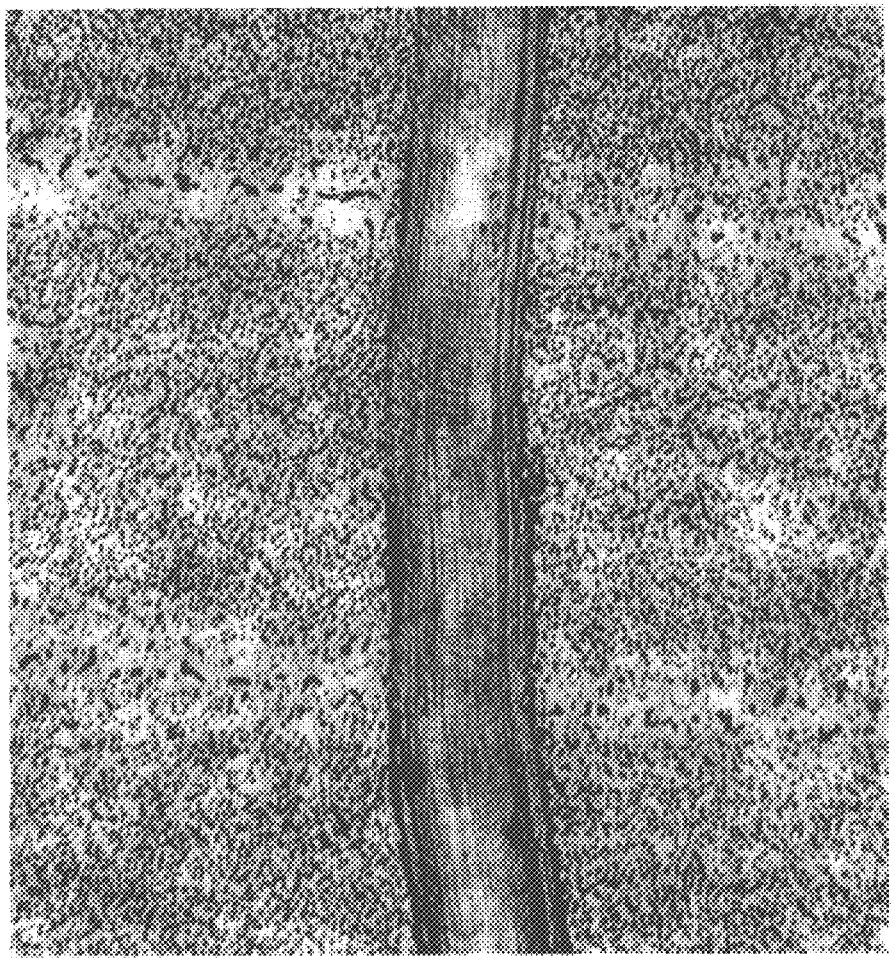
FIG. 4 illustrates a micrograph showing the scratch resistance test result for a substrate coating (see example 21).

FIG. 1 shows the comparative example, Example 18, scratched by the DUR-O-Test instrument with a spring tension of 0.5 Newton (N) and FIG. 2 shows Example 19 scratched by the DUR-O-TEST instrument with a spring tension of 20 N. In FIG. 1 the substrate can be clearly seen where the coating was scratched. In FIG. 2 the substrate is not clearly revealed. FIG. 3 shows Example 20 scratched by the DUR-O-TEST instrument with a spring tension of 20 N. FIG. 4 shows Example 21 scratched with a spring tension of 20 N. Neither shows any revealed substrate.

Figure 5:
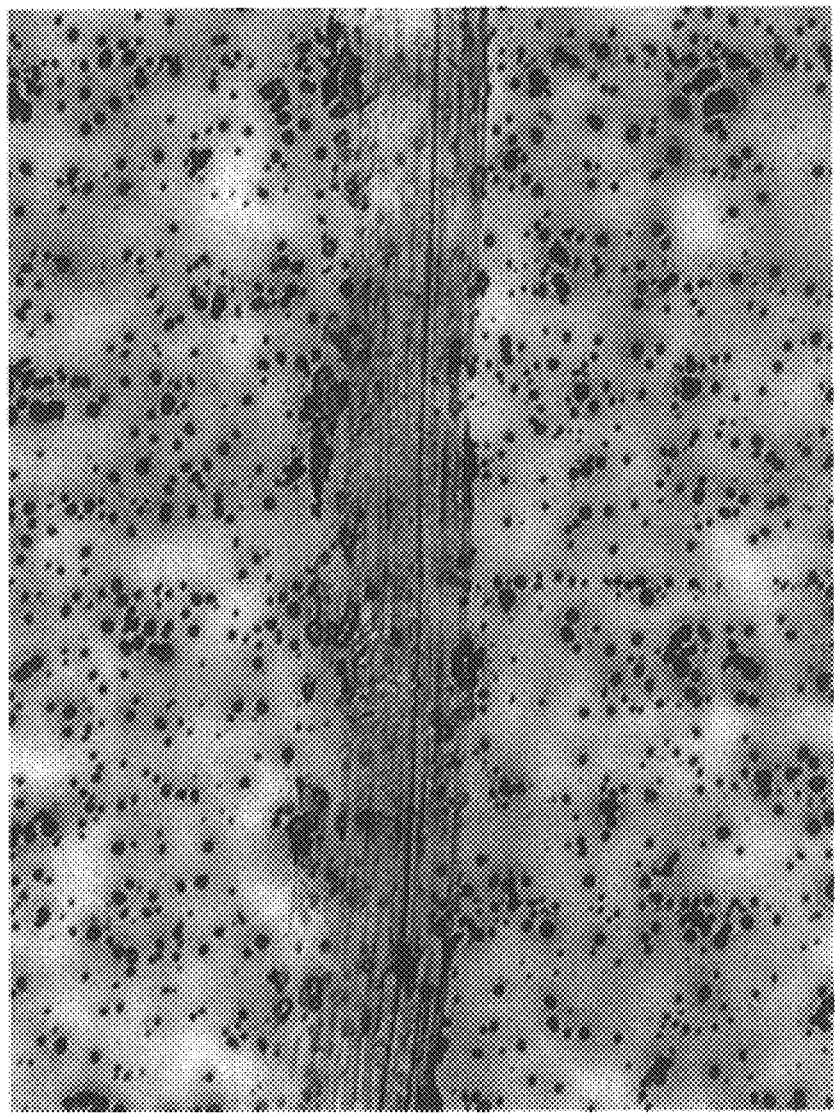
FIG. 5 illustrates a micrograph showing the scratch resistance test result for a substrate coating (see example 22).
Figure 6:
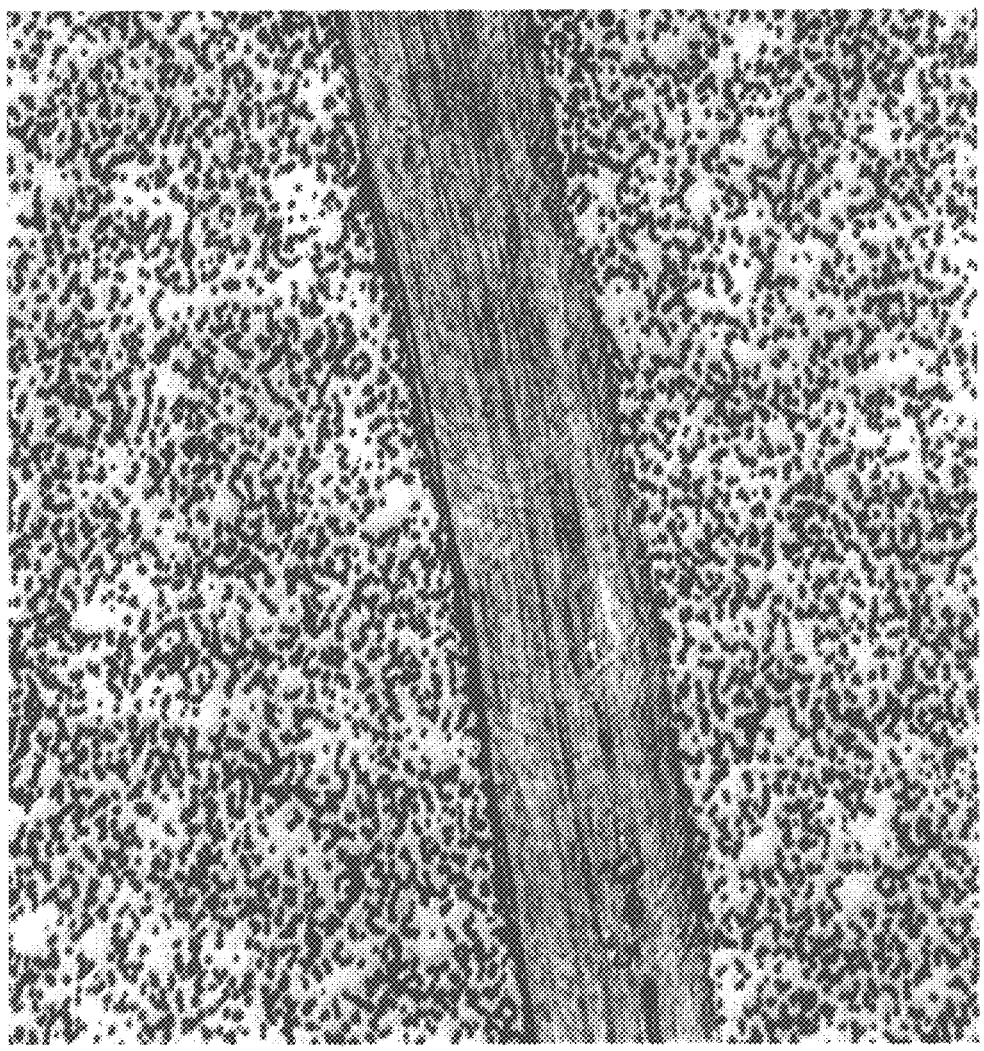
FIG. 6 illustrates a micrograph showing the scratch resistance test result for a substrate coating (see example 23).

FIG. 5 shows Example 22 scratched by the DUR-O-TEST instrument with a spring tension of 10 N and FIG. 6 shows Example 23 scratched by the DUR-O-TEST instrument with a spring tension of 20 N. Example 22 shows some revealed substrate and Example 23 shows none.

Figure 7:
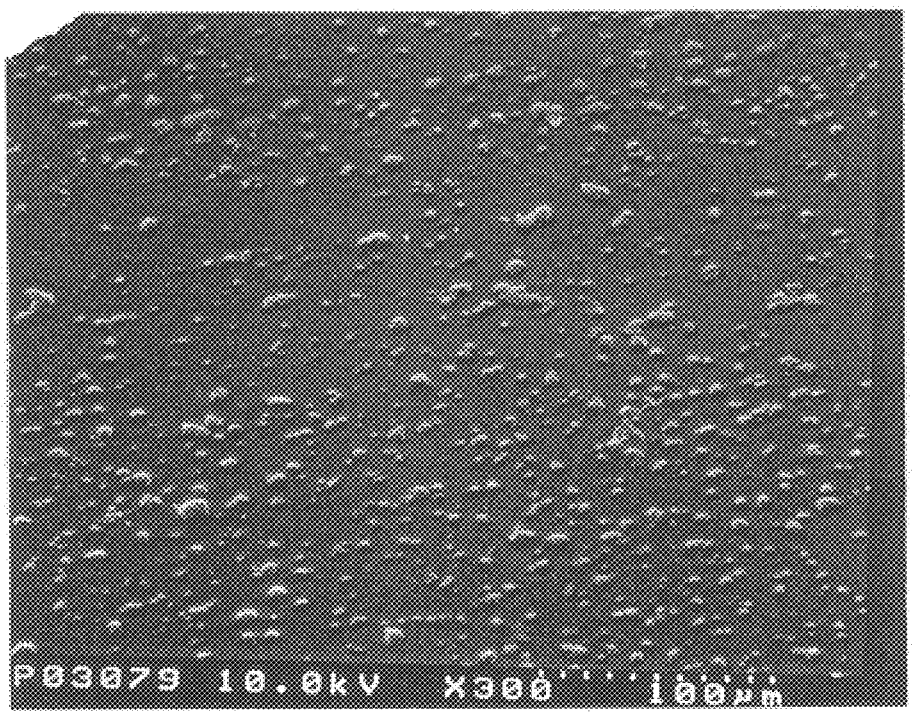
FIG. 7 illustrates a micrograph showing a substrate coating (see example 21).
Figure 8:
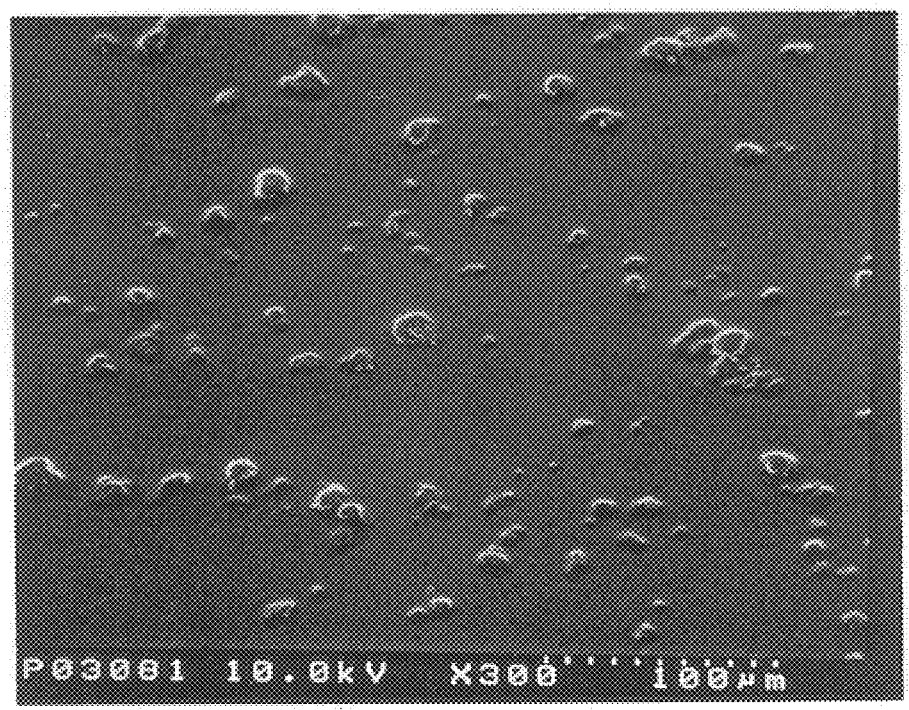
FIG. 8 illustrates a micrograph showing a substrate coating (see example 22).

FIG. 7 is a scanning electron micrograph of the coating of Example 21. FIG. 8 is a scanning electron micrograph of the coating of Example 22.

EXAMPLES 24–27

Formulations in 1-methoxypropan-2-ol:xylene (98:2, vol:vol) were coated onto Aluminum Substrate A (Examples 24 and 25) and Polyester Substrate A (Examples 26 and 27), and dried and, in the case of Examples 24 and 25, heat treated for 72 hours at 55° C., all as described previously. The dry film compositions were as follows.

|  | Examples 24, 26 | Examples 25, 27 |
| --- | --- | --- |
| Resin A | 68.4 | 68.4 |
| Resin B | 19.7 | 19.7 |
| Dye A | 2.0 | 2.0 |
| Dye B | 2.0 | 2.0 |
| Silikophen P50X | 5.9 | 5.9 |
| Particles C | 2.0 | 0 |
| Particles D | 0 | 2.0 |

Examples 24 and 25, on Aluminum Substrate A, were imaged in the Creo Trendsetter. The imaging results were as the previous comparative examples and indicate that the addition of the particles does not affect the imaging ability of the plate. Examples 26 and 27, on the Polyester Substrate A, were tested for scratch resistance using the DUR-O-Test instrument. The results were:

| Example | Force needed to scratch through the coating (N) |
| --- | --- |
| 26 | 5 |
| 27 | 1.5 |

While the invention has been described in terms of the foregoing specific embodiments, it will be apparent to those skilled in the art that various alterations and modifications may be made to the described embodiments without departing from the scope of the invention, which is limited only by the appended claims. The disclosed embodiments are provided merely by way of example.

What is claimed is:

1. A positive working heat imagable precursor comprising a substrate and a polymeric coating thereon, wherein all of the polymeric coating thereon is in a single layer applied to the substrate by application of an organic solvent containing the polymeric material of the polymeric coating, and removal of the organic solvent, wherein the coating comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the layer are selectively removed by the aqueous developer leaving behind unheated regions.

2. A precursor as claimed in claim 1, wherein the critical surface tension ($\gamma_c$) of the material of the polymeric particles is less than 50 milli-Nm$^{-1}$.

3. A precursor as claimed in claim 2, wherein said critical surface tension value is less than 35 milli-Nm$^{-1}$.

4. A precursor as claimed in claim 1, wherein the polymeric particles are selected from the group consisting of substituted-polyolefin particles, substituted-polyamide particles, substituted-polyacrylic particles, and mixtures thereof.

5. A precursor as claimed in claim 4, wherein the polymeric particles are selected from the group consisting of polyolefins and halogenated polyolefins.

6. A precursor as claimed in claim 1, wherein the polymeric particles are polytetrafluoroethylene particles.

7. A precursor as claimed in claim 1, wherein the polymeric particles are polyethylene particles.

8. A precursor as claimed in claim 1, wherein the polymeric matrix material comprises a material selected from the group consisting of a polymer or copolymer of styrene, a polymer or copolymer of hydroxystyrene, a polymer or copolymer of an alkoxystyrene, a sulphonamido or imido polymer or copolymer, a polymer or copolymer of maleiimide or of alkylmaleiimide or of dialkylmaleiimide, a hydroxycellulose, a carboxy cellulose, and a phenolic resin.

9. A precursor as claimed in claim 8, wherein the polymeric matrix material comprises a novolac resin.

10. A precursor as claimed in claim 1, wherein the aqueous developer is an aqueous alkaline developer.

11. A precursor as claimed in claim 1, wherein the polymeric particles constitute 0.25–50 wt % of the coating.

12. A precursor as claimed in claim 11, wherein the polymeric particles constitute 2–20 wt % of the coating.

13. A precursor as claimed in claim 12, wherein the polymeric particles constitute 5–14 wt % of the coating.

14. A precursor as claimed in claim 1, wherein the polymeric particles are embedded in the polymeric matrix and wherein the mean diameter of the particles exceeds the mean thickness of the coating.

15. A precursor as claimed in claim 1, wherein the coating comprises one or more insolubilizer(s) to confer on the coating the property that unheated regions of the coating have reduced solubility in the aqueous developer, compared with a corresponding coating without the insolubilizer(s).

16. A precursor as claimed in claim 1, wherein the solubility of the coating in the aqueous developer is not increased by ambient ultra-violet radiation.

17. A precursor as claimed in claim 1, comprising an absorber compound which absorbs incident radiation in the wavelength range 600–1400 nm and converts it to heat.

18. A precursor as claimed in claim 17, wherein the matrix material contains said absorber compound.

19. A precursor as claimed in claim 1, wherein the composition contains a cyanine dye.

20. A precursor as claimed in claim 1, wherein the composition contains a cationic triarylmethane dye.

21. A method of manufacturing a precursor as claimed in claim 1, comprising the following steps carried out in the order stated:
(a) making a liquid composition comprising the organic solvent, the polymeric matrix material dissolved therein, and the polymeric particles dispersed therein;
(b) applying said liquid composition to the substrate in a single layer; and
(c) removing the organic solvent.

22. A method as claimed in claim 21, comprising the step carried out subsequent to step (c), of subjecting the precursor to a stabilizing heat treatment.

23. A method of preparing a lithographic printing plate, mask or electronic part from a precursor as claimed in claim 1, the method comprising the steps of
(i) heating the coating imagewise; and
(ii) removing the heated regions of the coating using said aqueous developer.

24. An article prepared by a method as claimed in claim 23.

25. A positive working heat imageable precursor comprising a substrate and a polymeric coating thereon, wherein all of the polymeric coating thereon is in a single layer applied to the substrate by application of an organic solvent containing the polymeric material of the polymeric coating, and removal of the organic solvent, wherein the coating comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the layer are selectively removed by the aqueous developer leaving behind unheated regions and the precursor further comprises 0.1–10% of a siloxane polymer, by weight of the composition.

26. A positive working heat imagable lithographic precursor comprising a substrate and a polymeric coating thereon, wherein the polymeric coating thereon is provided in more than one layer, wherein one layer of the coating, not being the outer layer, is formed by application of an organic solvent containing the polymeric material of that layer and removal of the organic solvent, wherein that layer comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions.

27. A method of preparing a lithographic printing plate, mask or electronic part from a precursor as claimed in claim 26, the method comprising the steps of
(i) heating the coating imagewise; and
(ii) removing the heated regions of the coating using said aqueous developer.

28. A positive working heat imagable printing plate precursor or electronic part precursor or mask precursor, comprising a substrate and a polymeric coating thereon, wherein all of the polymeric coating thereon is in a single layer applied to the substrate by application of an organic solvent containing the polymeric material of the polymeric coating, and removal of the organic solvent, wherein the coating comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the layer are selectively removed by the aqueous developer leaving behind unheated regions; wherein the coating has improved mechanical properties, compared with a corresponding coating with no such particles.

29. A method of improving the mechanical properties of a coating provided on a heat imagable printing plate precursor or electronic part precursor or mask precursor, the precursor comprising a substrate and a polymeric coating thereon, wherein all of the polymeric coating thereon is in a single layer applied to the substrate by application of an organic solvent containing the polymeric material of the polymeric coating, and removal of the organic solvent, wherein the coating comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the layer are selectively removed by the aqueous developer leaving behind unheated regions; wherein the coating has improved mechanical properties, compared with a corresponding coating with no such particles.

30. A positive working heat imagable lithographic precursor comprising a substrate and a polymeric coating thereon, wherein the polymeric coating thereon is provided in more than one layer, wherein one layer of the coating, not being the outer layer, is formed by application of an organic solvent containing the polymeric material of that layer, and removal of the organic solvent, wherein that layer comprises a polymeric matrix material and polymeric particles therein, wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions; preferably wherein the coating has improved mechanical properties, compared with a corresponding coating with no such particles.

31. A method of improving the mechanical properties of a coating provided on a heat imagable printing plate precursor or electronic part precursor or mask precursor, the precursor comprising a substrate a polymeric coating thereon, wherein the polymeric coating thereon is provided in more than one layer, wherein one layer of the coating, not being the outer layer, is formed by application of an organic solvent containing the polymeric material layer and removal of the organic solvent, wherein that same layer comprises a polymeric matrix material and polymeric particles therein wherein the polymeric matrix material is soluble in an organic solvent and the polymeric particles are insoluble in the organic solvent, the coating having the property that when imagewise heated and then subjected to an aqueous developer, heated regions of the coating are selectively removed by the aqueous developer leaving behind unheated regions; preferably wherein the coating has improved mechanical properties, compared with a corresponding coating with no such particles.

* * * * *

UNITED STATES PATENT AND TRADEMARK OFFICE
CERTIFICATE OF CORRECTION

PATENT NO. : 6,300,038 B1
DATED : October 9, 2001
INVENTOR(S) : Shimazu et al.

It is certified that error appears in the above-identified patent and that said Letters Patent is hereby corrected as shown below:

Title page,
Item [54], Title: "IMAGABLE" should read -- IMAGEABLE --

Column 1,
Line 1, "IMAGABLE" should read -- IMAGEABLE --
Line 62, "sulphonyl" should read -- sulfonyl --

Column 2,
Line 32, "develop ability" should read -- developability --

Column 3,
Line 11, "DRAWING" should read -- DRAWINGS --
Line 14, "Coating" should read -- coating --
Line 43, "sulphonamido" should read -- sulfonamido --
Line 44, "maleiimide" should read -- maleimide --
Line 45, "alkylmaleiimide" should read -- alkylmaleimide --; and "dialkylmaleiimide" should read -- dialkylmaleimide --.
Line 58, "A" should be deleted Column 5,
Line 48, "quarternized" should read -- quaternized --

Column 6,
Lines 55 and 59, "ie" should read -- i.e., --

Column 7,
Line 41, "is" should read -- n is --

Column 9,
Line 20, "terephathlate" should read -- terephthalate --

Column 12,
Lines 40 and 54, "novolak" should read -- novolac --

Column 15,
Line 45, "Desintometer" should read -- Densitometer --

Column 17,
Line 2, "was" should read -- were --
Line 24, "Epsom" should read -- Epson --

UNITED STATES PATENT AND TRADEMARK OFFICE
CERTIFICATE OF CORRECTION

PATENT NO. : 6,300,038 B1
DATED : October 9, 2001
INVENTOR(S) : Shimazu et al.

It is certified that error appears in the above-identified patent and that said Letters Patent is hereby corrected as shown below:

Column 18,
Line 56, "sulphonamido" should read -- sulfonamido --
Line 57, "malei-" should read -- male- --
Line 58, "alkylmaleiimide" should read -- alkylmaleimide --
Line 58, "dialkylmaleiimide" should read -- dialkylmaleimide --

Column 19,
Line 61, "imagable" should read -- imageable --

Column 20,
Lines 14, 32, 49 and 67, "imagable" should read -- imageable --

Column 21,
Line 2, "substrate a" should read -- substrate and a --

Signed and Sealed this

Second Day of April, 2002

*Attest:*

JAMES E. ROGAN
*Director of the United States Patent and Trademark Office*

*Attesting Officer*